(12) United States Patent
Ke et al.

(10) Patent No.: US 10,141,181 B2
(45) Date of Patent: Nov. 27, 2018

(54) TIN PULL-BACK AND CLEANING COMPOSITION

(71) Applicant: BASF SE, Ludwigshafen (DE)

(72) Inventors: Jerry Jhih-Jheng Ke, New Taipei (TW); Tse Wei Yu, Chungli (TW); Yi-Ping Cheng, Taoyuan (TW)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/310,647

(22) PCT Filed: May 12, 2015

(86) PCT No.: PCT/IB2015/053483
§ 371 (c)(1),
(2) Date: Nov. 11, 2016

(87) PCT Pub. No.: WO2015/173730
PCT Pub. Date: Nov. 19, 2015

(65) Prior Publication Data
US 2017/0076939 A1    Mar. 16, 2017

(30) Foreign Application Priority Data
May 13, 2014    (EP) .................................... 14168103

(51) Int. Cl.
*C09K 13/00*    (2006.01)
*H01L 21/02*    (2006.01)
(Continued)

(52) U.S. Cl.
CPC ........ *H01L 21/02063* (2013.01); *C09K 13/00* (2013.01); *C11D 3/3723* (2013.01);
(Continued)

(58) Field of Classification Search
None
See application file for complete search history.

(56) References Cited

U.S. PATENT DOCUMENTS 6,136,711 A    10/2000    Grumbine et al.
7,919,445 B2    4/2011    Mellies
(Continued)

FOREIGN PATENT DOCUMENTS

CN    1764739 A    4/2006
CN    103429789 A    12/2013
(Continued)

OTHER PUBLICATIONS

Extended Search Report dated Jul. 10, 2014 Application No. 14168103.1.
(Continued)

*Primary Examiner* — Shamim Ahmed
(74) *Attorney, Agent, or Firm* — Oblon, McClelland, Maier & Neustadt, L.L.P.

(57) ABSTRACT

The present invention relates to a novel composition that may be used to control the etching rate of TIN with respect to W, and remove any residues from the surface, e.g. organic or inorganic residues that could contain fluorine (F), which composition comprises a) an aliphatic or aromatic sulfonic acid; b) one or more inhibitor(s); c) an aprotic solvent; d) a glycol ether; and e) water. The present invention also relates to a kit comprising said composition in combination with an oxidant and optionally a stabilizer of the oxidant, and the use thereof.

18 Claims, 4 Drawing Sheets

(51) Int. Cl.
  *C11D 11/00* (2006.01)
  *H01L 21/3213* (2006.01)
  *C11D 3/37* (2006.01)
  *C11D 3/39* (2006.01)
  *C11D 7/26* (2006.01)
  *C11D 7/32* (2006.01)
  *C11D 7/34* (2006.01)
  *C11D 7/50* (2006.01)
  *C11D 17/04* (2006.01)
  *H01L 21/311* (2006.01)

(52) U.S. Cl.
  CPC .......... *C11D 3/3942* (2013.01); *C11D 3/3947* (2013.01); *C11D 7/263* (2013.01); *C11D 7/32* (2013.01); *C11D 7/34* (2013.01); *C11D 7/5009* (2013.01); *C11D 7/5013* (2013.01); *C11D 11/0047* (2013.01); *C11D 17/041* (2013.01); *H01L 21/31111* (2013.01); *H01L 21/32134* (2013.01); *H01L 21/31144* (2013.01)

(56) References Cited

U.S. PATENT DOCUMENTS

| | | |
|---|---|---|
| 8,623,587 B2 | 1/2014 | Kamata et al. |
| 2003/0130146 A1 | 7/2003 | Egbe et al. |
| 2005/0217697 A1 | 10/2005 | Egbe et al. |
| 2005/0282391 A1 | 12/2005 | Vacassy et al. |
| 2006/0189141 A1 | 8/2006 | Mahlkow et al. |
| 2007/0161243 A1 | 7/2007 | Mellies |
| 2009/0065735 A1 | 3/2009 | Kolics et al. |
| 2009/0131295 A1* | 5/2009 | Cui ................... H01L 21/02063 510/176 |
| 2009/0133716 A1* | 5/2009 | Lee .................... C09G 1/02 134/3 |
| 2010/0043823 A1* | 2/2010 | Lee ..................... C11D 7/3263 134/1.3 |
| 2010/0163788 A1 | 7/2010 | Visintin et al. |
| 2010/0242999 A1 | 9/2010 | Quillen et al. |
| 2013/0276284 A1* | 10/2013 | Brosseau ................ C22B 7/007 29/426.1 |
| 2013/0296214 A1* | 11/2013 | Barnes ............. H01L 21/02063 510/176 |
| 2014/0000650 A1 | 1/2014 | Wood et al. |

FOREIGN PATENT DOCUMENTS

| | | |
|---|---|---|
| EP | 1 552 342 B1 | 4/2012 |
| JP | 5370358 B2 | 12/2013 |
| WO | WO 03/060045 A1 | 7/2003 |
| WO | WO 2006/009641 A1 | 1/2006 |
| WO | WO 2006/138505 A1 | 12/2006 |
| WO | WO 2008/080097 A2 | 7/2008 |
| WO | WO 2010/028186 A1 | 3/2010 |
| WO | WO 2012/009639 A2 | 1/2012 |
| WO | WO 2013/101907 A1 | 7/2013 |

OTHER PUBLICATIONS

International Search Report dated Oct. 12, 2015 in PCT/IB2015/053483.

S. Lippy, et al. "TiN metal hard mask removal with selectivity to tungsten and Tin liner", The Electrochemical Society, Abstract #2124, 224th ECS Meeting. 2013, 1 page.

Emanuel Cooper, et al., "Selective high-throughput TiN etching methods", Diffusion and Defect Data, Part B: Solid State Phenomena, vol. 195, 2013, XP008170274, 4 pages.

Office Action in Chinese Patent Application No. 201580025719.3, dated Aug. 16, 2018 with English Translation.

* cited by examiner

TIN PULL-BACK AND CLEANING COMPOSITION

BACKGROUND OF THE INVENTION

1. Field of the Invention

The present invention relates to a composition for post-implant, etch/post-etch and post-ash related processes in the semiconductor/IC production field. More specifically, the present invention relates to formulations capable of tuning the etch rates of titanium nitride (TiN) and tungsten (W) with the purpose of removing TiN and organic and/or inorganic residues from a surface.

2. Description of the Prior Arts

Integrated circuits (IC) are made up of millions of active devices formed in or on a silicon substrate. The active devices, which are initially isolated from one another, are united to form functional circuits and components. The devices are interconnected through the use of well-known multilevel interconnections. Interconnection structures normally have a first layer of metallization, an interconnection layer, a second level of metallization, and in recent years a third and subsequent level of metallization.

In the semiconductor/IC production field, the post-etch residues (PERs) are usually removed by means of wet cleaning processes. Solutions comprising complexing agents and water can be used here. Moreover, selective etching of different layers, within the microelectronic structure, is considered a critical and crucial step in the IC fabrication process. In the first layer of metallization, which includes a tungsten plug (W-plug), TiN and low-k dielectric material, it is desired to be able to etch TiN at such a rate, that the W-plug is not significantly damaged. In subsequent layers of metallization, which mainly contain copper (Cu-plug), it is desired to be able to etch the TiN at such a rate, that the copper plug is not significantly damaged. Depending on the individual thicknesses of the TiN and metal layers, which depend greatly on the integration scheme used, this requires solutions that are capable of tuning the etch rates of TiN and metal (W or Cu).

It should be understood, that the presence of oxidants in the formulations, such as hydrogen peroxide, can be necessary to achieve a sufficiently high etching rate of TiN. However, an undesired effect is that the etch rate for tungsten, copper and related metals increases as well by the addition of an oxidant such as hydrogen peroxide. Thus, there is a need to find suitable additives that allow tuning of the etch rates of TiN and W whilst being capable of removing organic and/or inorganic residues (e.g. F-containing) from the wafer surface.

U.S. Pat. No. 7,919,445 relates to a novel solution for the removal of post-etch residues. Imidazoline compounds as corrosion inhibitors are preferably added for the treatment of wafer surfaces having, for example, tungsten and aluminum metallization.

WO03060045 relates to aqueous compositions used to remove photoresist, etch and ash residue and contaminants from semiconductor substrates. A single corrosion inhibitor compound or mixture of corrosion inhibitors such as for example benzotriazole, benzoic acid, malonic acid, gallic acid, catechol, ammonium malonate, can be used in the stripping and cleaning compositions. WO03060045 does not use oxidants for the etching of TiN, nor does it discuss the protection of W.

WO06138505 relates to dense fluid compositions, e.g., supercritical fluid compositions, useful for the removal of hardened photoresist, post-etch residue and/or bottom anti-reflective coating layers from the surface of microelectronic devices. However, at least one fluoride source is contained in said fluid compositions, which would damage low-k dielectric materials. WO06138505 does not concern the etching of TiN and the protection of W, either.

EP1552342B1 is concerned with selectively removing etching residues from a microstructure of an object without attacking metal and or silicon dioxide films exposed to the composition used for removing the residues. Accordingly, said prior art hardly discusses the etching of TiN. Further, fluoride is also contained in the composition used in said prior art.

U.S. Pat. No. 6,136,711 describes a chemical mechanical polishing composition that is capable of polishing tungsten at high rates with minimal etching and/or corrosion. Said composition comprises a compound that is capable of etching tungsten, and comprises at least one inhibitor of tungsten etching. Specifically, a two-component solution is described with the two components being a film-forming agent which comprises a one-nitrogen atom-containing cyclic compound, and a silane compound, respectively.

In previous patents or study, the W-inhibitor, if present, also suppresses TiN etching rates. Thus, there is a need to find additives, which allow control over the relative etching rates of W and TiN, respectively. Moreover, if an additive binds, by either covalent or non-covalent bonds, to W and cannot be removed by subsequent rinsing, the resistance of the W-plug will not be acceptable and will affect reliability. Therefore, the solution should not only to protect the W surface, but also contain components that may be removed by a rinsing step with an appropriate solvent.

SUMMARY OF THE INVENTION

Accordingly, the present invention provides a novel composition that may be used to control the etching rate of TiN with respect to W, and remove any residues from the surface, e.g. organic or inorganic residues that could contain fluorine (F).

One aspect of the present invention is to provide a composition that has a controllable etch rate ratio of TiN with respect to W and is capable of removing F-containing residues, during the semiconductor/IC production processes, said composition comprising:
 a) an aromatic or aliphatic sulfonic acid;
 b) one or more inhibitor(s);
 c) an aprotic solvent;
 d) a glycol ether; and
 e) water.

Another aspect of the present invention is the use of said composition in combination with an oxidant and optionally a stabilizer of the oxidant, this solution comprising:
 A) a composition comprising
  a) an aromatic or aliphatic sulfonic acid;
  b) one or more inhibitor(s);
  c) an aprotic solvent;
  d) a glycol ether;
  e) water;
 B) an oxidant, such as hydrogen peroxide; and optionally
  a stabilizer of said oxidant.

Other objectives, advantages and novel features of the invention will become more apparent from the following detailed description when taken in conjunction with the accompanying drawings.

BRIEF DESCRIPTION OF THE DRAWINGS

FIG. 7A is a schematic representation, and FIG. 7B is a 3D-rendering from MM2 optimization of the structure, with R=CH$_3$ in both cases.

DETAILED DESCRIPTION OF THE PREFERRED EMBODIMENTS

While the present disclosure is susceptible of embodiment in various forms, there will hereinafter be described a presently preferred embodiment with the understanding that the present disclosure is to be considered an exemplification of the disclosure and is not intended to limit the disclosure to the specific embodiment illustrated.

In one embodiment of the present application, a composition is prepared by mixing a) an aliphatic or aromatic sulfonic acid; b) one or more inhibitor(s); c) an aprotic solvent; d) a glycol ether; and e) water in any order. The composition may be used for the preparation of a formulation in which the TiN and W etch rates can be tuned, as well as organic and/or inorganic residues (optionally containing F) can be removed, during the semiconductor/IC production processes. To this end, an oxidant can be added to the composition and optionally a stabilizer of said oxidant can be added.

Accordingly, in another embodiment of the present application, a formulation is prepared by mixing a) an aromatic or aliphatic sulfonic acid; b) one or more inhibitor(s); c) an aprotic solvent; d) a glycol ether; and e) water in any order, followed by the addition of an oxidant, and optionally a stabilizer of said oxidant.

Then, blanket wafers (tungsten, TiN, low-k) or patterned wafer to be treated are broken into coupons, and then brought into contact with the formulations as prepared.

Figure 1:
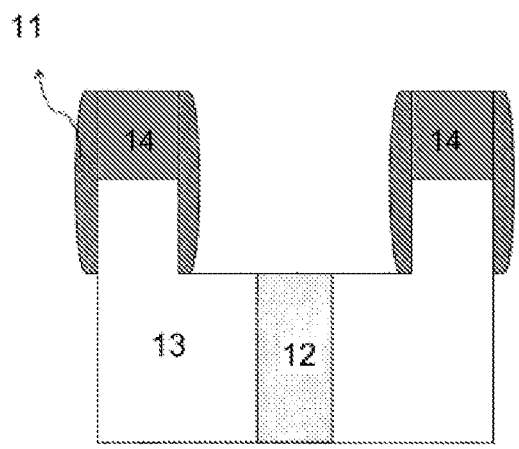
FIG. 1 illustrates the generic structure on the wafer in the first layer of metallization, specifying C-, O-, F-, Ti- and N-containing residues 11, the W-plug 12, low-k material 13 and the TiN 14.
Figure 2:
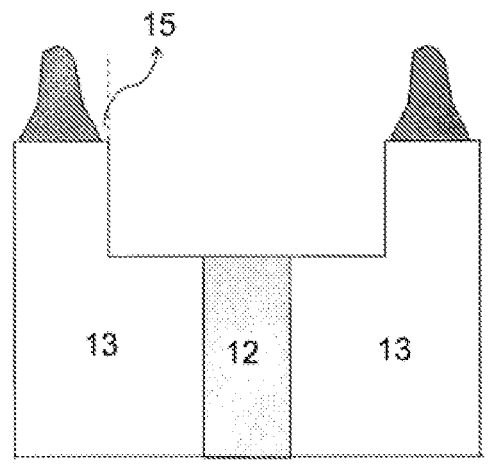
FIG. 2 illustrates the removal of C-, O-, F-, Ti- and N-containing residues 11 and the partial etching of TiN 14 (TiN pull-back 15) in the first layer of metallization FIG. 3 schematically depicts the adsorption-desorption control of the inhibitor(s) and the role of water, solvent and the inhibitor in these processes.

As illustrated in FIGS. 1-2, residue removal and TiN etching take place simultaneously, while the etch rate of TiN to tungsten is controlled by varying the components in the composition. Further, the inhibitor may be removed after a rinse with appropriate solvent, such as water or isopropanol (IPA).

The inhibitor(s) may be selected from the class of compounds known as imidazolidinones (class a), imidazolidines (class b), or 2-oxazolidinones (class c).

a) Imidazolidinones

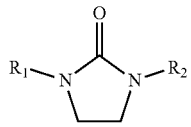

$R_1$, $R_2$=—H, —$C_nH_{2n+1}$, —$C_6H_5$, —$CH_2C_6H_5$, —OH, —$C_nH_{2n}OH$ with n=1-10, —C(O)NR$_3$R$_4$, —NR$_3$R$_4$, —C(O)OR$_5$ $R_3$, $R_4$=—H, —$C_nH_{2n+1}$, —$C_6H_5$, —$CH_2C_6H_5$, —C(O)OH, —OH, —$C_nH_{2n}$OH with n=1-10

$R_5$=—H, —$C_nH_{2n+1}$, —$CH_2C_6H_5$, —$C_6H_5$, —$C_nH_{2n}$OH with n=1-10, —NR$_3$R$_4$ b) Imidazolidines

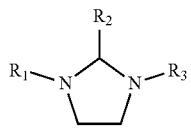

$R_1$, $R_2$, $R_3$=—H, —$C_nH_{2n+1}$, —$C_6H_5$, —$CH_2C_6H_5$, —OH, —$C_nH_{2n}$OH with n=1-10, —C(O)NR$_4$R$_5$, —NR$_4$R$_5$, —C(O)OR$_6$ $R_4$, $R_5$=—H, —CnH$_{2n-1}$, —$C_6H_5$, —$CH_2C_6H_5$, —C(O)OH, —OH, —$C_nH_{2n}$OH with n=1-10

$R_6$=—H, —CnH$_{2n+1}$, —$CH_2C_6H_5$, —$C_6H_5$, —CnH$_{2n}$OH with n=1-10, —NR$_4$R$_5$ c) 2-Oxazolidinones

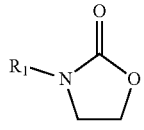

$R_1$=—H, —CnH$_{2n+1}$, —$C_6H_5$, —$CH_2C_6H_5$, —OH, —$C_nH_{2n}$OH with n=1-10, —C(O)NR$_2$R$_3$, —NR$_2$R$_3$, —C(O)OR$_4$ $R_2$, $R_3$=—H, —CnH$_{2n+1}$, –$C_6H_5$, —$CH_2C_6H_5$, —C(O)OH, —OH, —$C_nH_{2n}$OH with n=1-10

$R_4$=—H, —CnH$_{2n+1}$, —$CH_2C_6H_5$, —$C_6H_5$, —CnH$_{2n}$OH with n=1-10, —NR$_2$R$_3$ The inhibitor may be for instance ethylene urea, N-(2-Hydroxyethyl)ethylene urea, 1-(2-Hydroxyethyl)-2-imidazolidinone, or 2-oxazolidinone, 3-methyl-2oxazolidone, and their derivatives. The inhibitors may also be a polyethyleneimine or polypropyleneimine.

The inhibitor(s) may be present in the composition of this invention in an amount ranging from 0.1 to 10 wt %, such as 2.7 wt %, based on the total weight of the composition.

Figure 3:
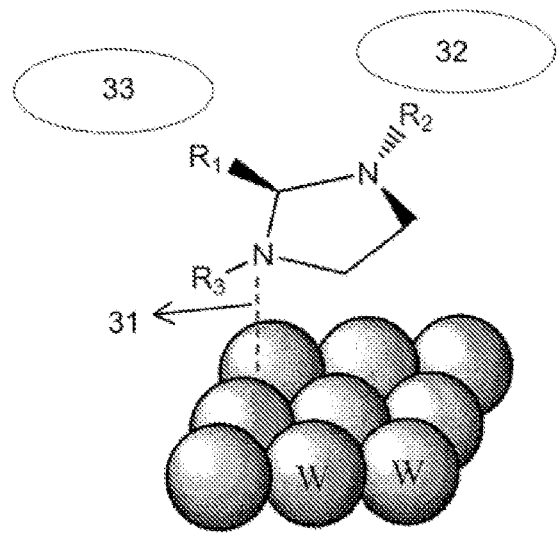

While not wishing to be bound by this theory, it is believed that the adsorption control may be achieved by the coordinate bonding 31 of the inhibitor(s) to the surface of the metal plug, as illustrated for tungsten in FIG. 3. Further, the desorption control may be achieved by the interaction between the inhibitor and the solvent 32 or water 33 respectively, due to functional groups that are solvent preferable (e.g. R$_2$) or water preferable (e.g. R$_1$). Thus, the etching rate of the metal plug may be controlled by the solvent and water ratio, depending on which process (adsorption or desorption) is stronger. In addition, the etching rates of various compounds can be controlled by changing the functional groups within the various classes of inhibitor(s). The glycol ether may be selected from butyl diglycol, 2-hexoxy-1-ethanol, tetrahydrofurfurylalcohol, ethylene glycol monomethyl ether, ethylene glycol monoethyl ether, ethylene glycol monobutyl ether, 2-(naphthalene-6-yloxy)polyethoxyethanol, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, propylene glycol monomethyl ether, propylene glycol dimethyl ether, propylene glycol monobutyl ether, propylene glycol, monoproply ether, dipropylene glycol monomethyl ether, dipropylene glycol monopropyl ether, dipropylene glycol monoisopropyl ether, dipropylenemonobutylether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane or 2-(2-butoxyethoxy) ethanol, or a mixture thereof.

The glycol ether may be present in the composition of this invention in an amount ranging from 1 to 60%, based on the total weight of the composition.

In the composition of the present disclosure, the solvent and water ratio is from 1:10 to 2:1, preferably from 1:8 to 1:1, most preferably from 1:5 to 1:1.

Figure 4:
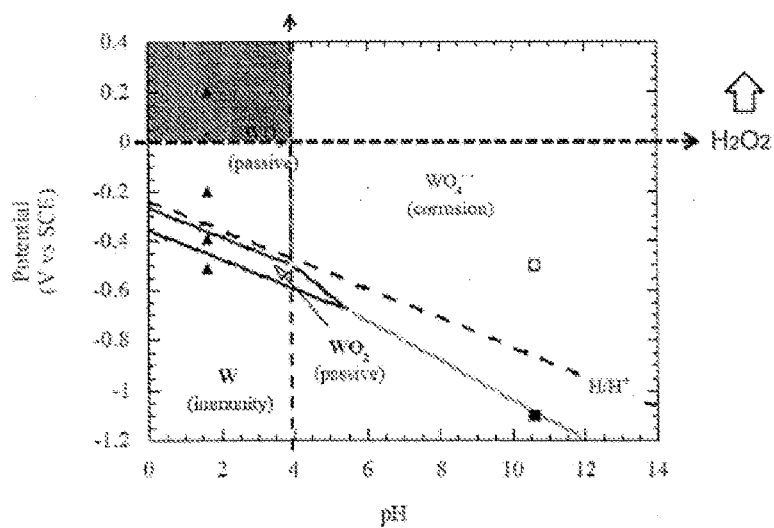
FIG. 4 shows the Pourbaix diagram of W (solid symbols—applied potentials; open symbols—OCP).
Figure 6:
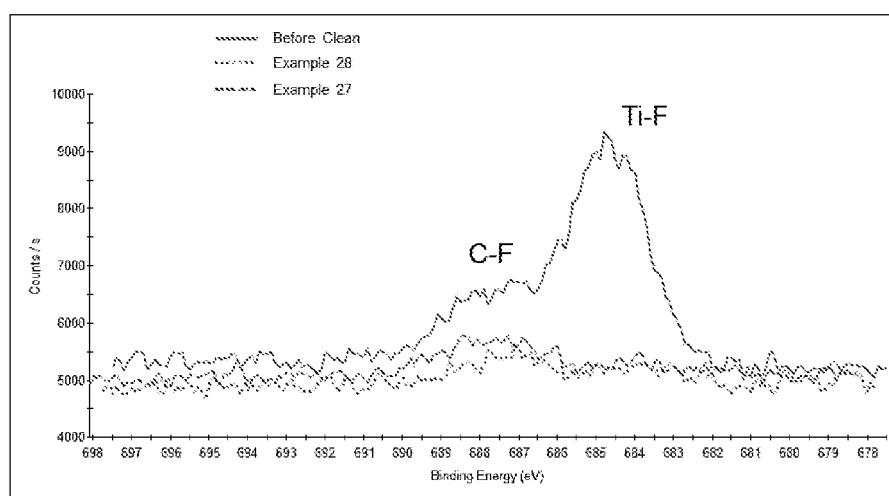
FIG. 6 shows the XPS fluorine spectra before cleaning and after the cleaning with the specified formulations.

As illustrated in FIG. 4, a lower pH would lead to a lower tungsten etching rate (the black region is considered safe from etching). Accordingly, a low pH (<4) to lower tungsten corrosion is desired. However, low pH means that the activity of oxidant is low, which leads to a low TiN etching rate. The present invention successfully finds both novel compounds to lower the etching of W, whilst increasing the etch rate of TiN, keeping an acceptably low etch rate on the low-k material by the addition of suitable acids (aromatic and aliphatic sulfonic acids), and removing organic and/or inorganic residues (FIG. 6). This can be further explained by chemical equation 1:

$$TiN+H_2O+2H_2O_2 \rightarrow NH_{3(g)}+H_2TiO_{3(aq)}+O_{2(g)} \quad \text{(chemical equation 1)}$$

To enhance the TiN etching rate, the right forward direction for the above equation is preferable.

While not wishing to be bound by this theory, it is known to those skilled in the art that the produced metatitanic acid ($H_2TiO_3$) has a complex structure and can readily react with water to give a host of Ti(IV) compounds in (partly) aqueous solutions. Depending on the pH of the solution, an equilibrium is established which contains the compounds depicted in chemical equation 2, in addition to a myriad of other structures, such as oligomers and nanotubes consisting of Ti(IV) species of various hydration number.

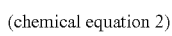

(chemical equation 2)

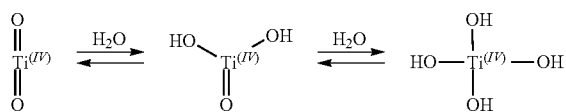

Figure 7B:
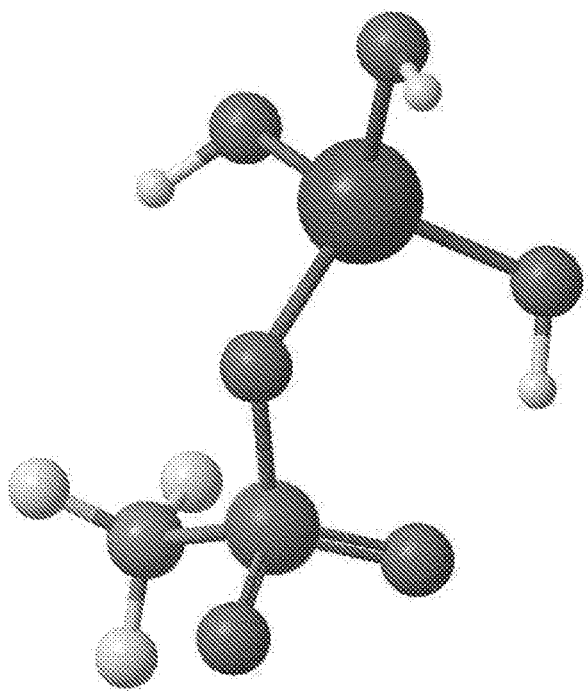
FIGS. 7A and 7B show the structures formed by the exchange of a hydroxyl ligand with a sulfonic acid ligand.
Figure 7A:
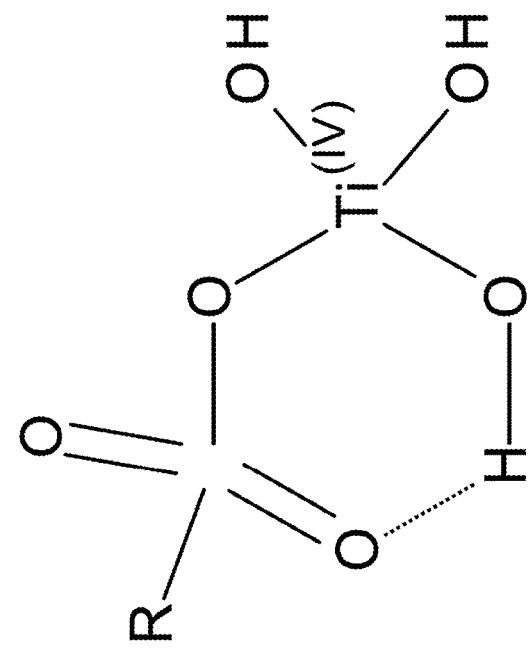

Below, we show that adding a sulfonic acid to the solution, increases the etch rate of the TiN. We attribute this to a shift in the equilibrium of chemical equation 1, by the coordination of the sulfonic acid to the titanium(IV), removing it from the right-hand side of the equation and shifting the equilibrium to give an enhanced etch rate of the titanium. The structure formed by the exchange of a hydroxyl ligand with a sulfonic acid ligand is depicted in FIG. 7. On the left of FIG. 7 is a schematic representation, and on the right of FIG. 7 a 3D-rendering from MM2 optimization of the structure, with R=$CH_3$ in both cases. The structure shows the coordination of the sulfonic acid to the Ti(IV) centre. As a stabilizing effect, the remaining OH groups on the Ti(IV) centre can form hydrogen bonds to the sulfonic acid ligand (depicted by the hashed bond), which is clearly shown in 3D. Hydrogen bonds are well-known, to those skilled in the art, to stabilize structures and in addition, this specific hydrogen bond results in the formation of a 6-membered ring, which provides additional stabilization. As such, the formation of such a stable structure additionally supports the observation of an increased TiN etch rate in the presence of sulfonic acid compounds, by shifting the equilibrium of chemical equation 1 to the right hand side. One additional effect to help drive the equilibrium to the right is that the aliphatic or aromatic sulfonic acids used here are soluble in the organic solvent component of the mixtures used in this invention. As such, they will increase the solubility of the various titanium (IV) species which are generated during the process.

The aromatic or aliphatic sulfonic acids may be used to adjust the pH value and to control lower W etching rate. In addition, said sulfonic acids may also contribute to the removal of metal-containing residues, by the formation of stabilizing coordination bonds as described earlier. Further, said sulfonic acids do not damage low-k materials and are good stabilizers of $H_2O_2$.

The aliphatic or aromatic sulfonic acid may be selected from alkyl sulfonic acid (such as methanesulfonic acid, ethanesulfonic acid, propanesulfonic acid, butanesulfonic acid and hexanesulfonic acid), 3-(N-morpholino)propane sulfonic acid (MOPS), 2-(N-morpholino)ethanesulfonic acid (MES), N-cyclohexyl-2-aminoethanesulfonic acid (CHES), 3-[4-(2-hydroxyethyl)-1-piperazinyl]propanesulfonic acid (HEPPS) or N-cyclohexyl-3-aminopropanesulfonic acid (CAPS), or a mixture thereof.

The aliphatic or aromatic sulfonic acid may be present in the composition of this invention in an amount ranging from 0.05 to 4 wt %, preferably from 0.1 to 1 wt %, most preferably from 0.1 to 0.5 wt %, such as 0.3 wt %, based on the total weight of the composition.

The aprotic solvent may be selected from dimethyl sulfoxide (DMSO), sulfolane, propylene carbonate, dimethylacetamide (DMAc), N-methyl-2-pyrrolidone (NMP) or dimethylformamide (DMF), or a mixture thereof.

The aprotic solvent may be present in the composition of this invention in an amount ranging from 5 to 50 wt %, preferably from 20 to 45 wt %, most preferably from 30 to 40 wt %, such as 35 wt %, based on the total weight of the composition.

In another embodiment of the present invention, an oxidant such as hydrogen peroxide ($H_2O_2$), peroxide urea, peroxydisulfuric acid, ammonium persulfate, peroxymonosulfuric acid, pyrosulfuric acid, ozone, particularly $H_2O_2$, may be added to the composition comprising a) analiphatic or aromatic sulfonic acid; b) one or more inhibitor(s); c) an aprotic solvent; d) a glycol ether; and e) water, to form a formulation.

The oxidant may be added in a volume ratio (the composition comprising components a) to e) to the oxidant) ranging from 65:1 to 8:1 (about from 0.5 to 3 wt %), preferably from 65:1 to 12:1 (about from 0.5 to 2.5 wt %), most preferably from 65:1 to 15:1 (about from 0.5 to 2 wt %), such as 32:1 (about 1 wt %).

Optionally, a stabilizer of the oxidant may be added to the formulation.

The stabilizer may be selected from amine-N-oxide (e.g. N-methylmorpholine N-oxide, pyridine-N-oxide), citric acid, 1-hydroxyethane 1,1-diphosphonic acid (HEDP), N-(hydroxyethyl)-ethylenediaminetriacetic acid (HEDTA), glycolic acid, lactic acid, hydroxybutyric acid, glyceric acid, malic acid, tartaric acid, malonic acid, succinic acid, glutaric acid, maleic acid, or a mixture thereof.

The stabilizer may be present in the composition of this invention in an amount ranging from 0.01 to 0.5 wt %, preferably from 0.01 to 0.1 wt %, most preferably from 0.01 to 0.05 wt %, such as 0.05 wt %, based on the total weight of the composition.

In another embodiment of the present application, a kit is provided. Said kit is constituted of A) a composition comprising: a) an aliphatic or aromatic sulfonic acid; b) one or more inhibitor(s); c) an aprotic solvent; d) a glycol ether; and e) water; and B) an oxidant, and optionally a stabilizer of said oxidant.

The kit may be used for tuning of the etch rates of W and TiN, respectively, and the removal of organic and/or inorganic residue (optionally containing F) from the wafer, during the semiconductor/IC production processes.

The following Experiments and Examples are conducted to illustrate the etching and etching rate of TiN and W plug respectively, and show the removal of F-containing residue.

Figure 5:
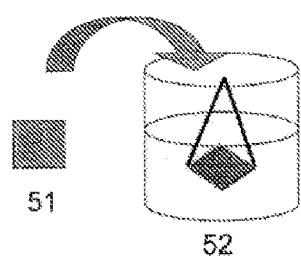
FIG. 5 schematically depicts an experimental set-up used in the experiments (thickness measurement; Etch Rates; Clean performance (SEM, TEM, XPS . . . )).

Experiments:

A. Etching Rates Experiment:
  Step 1. Blanket wafers (tungsten, TiN, low-k), or patterned wafer were selected from commercial sources.
  Step 2. Wafers were broken into smaller coupons 51, as depicted in FIG. 5.
  Step 3. The initial film thickness of the appropriate material was measured:
    1. For metals, a 4-point probe was used to measure initial layer thickness;
    2. For non-metals, ellipsometry was used to measure initial film thickness.
  Step 4. Formulations 52 were prepared as described below.
  Step 5. The formulations 52 were put into thermal circulation tanks to attain a stable target temperature; the temperatures used are similar to those used in common industrial processes (about 40 to 60° C.). The solution was agitated using a mechanical stirrer.
  Step 6. The coupons were fixed to a mechanical holder.
  Step 7. The coupons were contacted with the solution for a certain period of time (generally 10 minutes), as depicted in FIG. 5.
  Step 8. After a certain amount of time had elapsed, the contact between the solution and coupon was severed and the coupon was cleaned with ultra-pure water or IPA, or water/IPA mixture for about 15 seconds to 5 minutes, generally 1 minute.
  Step 9. The coupons were dried with N2 gas and a check was performed to ensure no water remained on surface.
  Step 10. The residual thickness was measured as described in Step 3.
  Step 11. The etching rates were calculated as described below.

For example, when the thickness before reaction is 330 Å, the thickness after reaction is 300 Å, and reaction time is 10 min, the etching rate is calculated as the following:

$$\text{The Etching Rate} = (330-300)/10 = 3 \text{ Å/min}$$

B. Patterned wafers surface residues composition evaluation
  The steps are the same as in A, but Steps 3, 10 and 11 were not performed.
  The elemental abundance was determined by XPS, as depicted in FIG. 6.

EXAMPLES

The following Examples are given to allow better understanding of the disclosure. These Examples are not to be construed as narrowing the scope of the disclosure in any aspect.

All percentage data in the present description are percent by weight, based on the total weight of the composition, except for that the oxidant is added in a volume ratio as the composition comprising components a) to e) to the oxidant, and calculated to be percent by weight. It goes without saying here that the amounts of the added components a) to e) in a composition add up to 100%.

Various Examples were performed following the steps described in the foregoing as summarized hereunder to illustrate the present disclosure and the comparison between the prior art and the present disclosure.

Examples 1-4

In Examples 1-4, citric acid was used as organic acid, and in Examples 3-4, Ablumine O (a mixture of 1-hydroxyethyl-2-alkylimidazolines) was used as an inhibitor. The balance is water.

TABLE 1

|  | Example 1 | Example 2 | Example 3 | Example 4 |
|---|---|---|---|---|
| Citricacid | 0.05 | 0 | 0.05 | 0.1 |
| BDG | 10 | 10 | 40 | 40 |
| NMP | 10 | 10 | 10 | 10 |
| 1-hydroxyethyl-2-alkylimidazolines | 0 | 0 | 0.05 | 0.05 |
| Balance | 79.95 | 80 | 49.9 | 49.85 |
| Hydrogen peroxide | 0.50 | 0.50 | 0.50 | 0.50 |
| TiN E/R (Å/min) | 2.5 | 2.5 | 0.2 | 0.1 |
| W E/R (Å/min) | 28.0 | 43.0 | 4.0 | 2.0 |

The results in Table 1 show that in the absence of an organic acid like citric acid (Example 2), the undesired W E/R was extremely high. Furthermore, the addition of Ablumine O as a W inhibitor (Examples 3-4) showed that suppression of W E/R simultaneously resulted in a significant TiN E/R suppression.

Example 5

In Example 5, NMP was replaced with DMSO. The balance is water.

TABLE 2

|  | Example 5 |
|---|---|
| Citricacid | 0.05 |
| BDG | 40 |

TABLE 2-continued

|  | Example 5 |
|---|---|
| DMSO | 10 |
| 1-hydroxyethyl-2-alkylimidazolines | 0.05 |
| Balance | 49.9 |
| Hydrogen peroxide | 0.50 |
| TiN E/R (Å/min) | 0.2 |
| W E/R (Å/min) | 4.0 |

The results in Table 2 show that change of solvent from NMP to DMSO did not change the W/TiN E/R ratio.

Examples 6-10

In Examples 6-10, citric acid was replaced with methanesulfonic acid and hydrogen peroxide was added. The results are summarized in Table 3. The balance is water.

TABLE 3

|  | Example 6 | Example 7 | Example 8 | Example 9 | Example 10 |
|---|---|---|---|---|---|
| Methanesulfonicacid | 0.05 | 0.1 | 0.1 | 0.1 | 0.1 |
| BDG | 40 | 20 | 10 | 10 | 10 |
| DMSO | 10 | 30 | 10 | 10 | 10 |
| 1-hydroxyethyl-2-alkylimidazolines | 0.05 | 0.05 | 0.05 | 0.05 | 0.05 |
| balance | 49.9 | 49.85 | 79.85 | 79.85 | 79.85 |
| Hydrogen peroxide | 0.50 | 0.50 | 0.50 | 0.50 | 1.00 |
| TiN E/R (Å/min) | 0.7 | 0.8 | 0.8 | 0.8 | 1.2 |
| W E/R (Å/min) | 4.0 | 4.0 | 2.0 | 2.0 | 2.0 |

The results in Table 3 show that use of methanesulfonic acid instead of citric acid and the addition of hydrogen peroxide, enhanced the TiN E/R without simultaneously increasing W E/R, and not only afforded more control over the etch ratio than citric acid, but also improved the W/TiN E/R ratio, which is desirable in IC production processes.

Examples 11-19

In Examples 11-19, Ablumine O (a mixture of 1-hydroxyethyl-2-alkylimidazolines) was replaced with 2-imidazolidinone as a W-inhibitor, and hydrogen peroxide was added as an oxidizer. The results are summarized in Table 4. The balance is water.

TABLE 4

|  | Example 11 | Example 12 | Example 13 | Example 14 | Example 15 |
|---|---|---|---|---|---|
| Methanesulfonicacid | 0.1 | 0 | 0.1 | 0.1 | 0.1 |
| BDG | 10 | 10 | 10 | 10 | 10 |
| DMSO | 10 | 10 | 10 | 10 | 10 |
| 2-imidazolidinone | 0.5 | 0.5 | 1 | 2 | 3 |
| Balance | 79.4 | 79.5 | 78.9 | 77.9 | 76.9 |
| Hydrogen peroxide | 1.00 | 1.00 | 1.00 | 1.00 | 1.00 |
| TiN E/R (Å/min) | 1.4 | 0.5 | 1.3 | 1.3 | 1.2 |
| W E/R (Å/min) | 13.0 | 13.0 | 10.0 | 8.0 | 8.0 |

|  | Example 16 | Example 17 | Example 18 | Example 19 |
|---|---|---|---|---|
| Methanesulfonicacid | 0.1 | 0.1 | 0.1 | 0.3 |
| BDG | 20 | 35 | 25 | 25 |
| DMSO | 40 | 25 | 35 | 35 |
| 2-imidazolidinone | 3 | 3 | 3 | 3 |
| Balance | 36.9 | 36.9 | 36.9 | 36.7 |
| Hydrogen peroxide | 1.00 | 1.00 | 1.00 | 1.00 |
| TiN E/R (Å/min) | 0.4 | 1.3 | 0.7 | 2 |
| W E/R (Å/min) | 5.0 | 4.0 | 5.4 | 5.0 |

The results in Table 4, specifically Examples 12, 13, 14 and 15, show that the use of sufficient 2-imidazolidinone can significantly lower the etch rate on W whilst retaining the etch rate on TiN. Examples 16, 17 and 18 show that changing the ratio and concentration of solvents BDG and DMSO will also change this selectivity, with Example 17 showing the lowest etch rate on W whilst keeping a high etch rate on TiN. In addition, the mixture of Example 17, without added hydrogen peroxide, showed an etch rate of low-k material of 0 Å/min (k=2.6) and 0.1 Å/min (k=2.3) at 60° C., respectively.

Examples 20-31

In Examples 20-31, other suitable organic acids and W inhibitors that may be used in the present disclosure were tested as summarized in Table 5. The balance is water.

TABLE 5

|  | Example 20 |  | Example 21 |
|---|---|---|---|
| Ethanesulfonic acid | 0.3 | 3-(N-morpholino)-propanesulfonic acid | 0.1 |
|  |  | Methanesulfonic acid | 0.5 |
| BDG | 25 | BDG | 25 |
| DMSO | 35 | DMSO | 35 |
| 2-imidazolidinone | 3.3 | 2-imidazolidinone | 3.5 |
| balance | 36.4 | balance | 35.9 |
| Hydrogen peroxide | 1.00 | Hydrogen peroxide | 1.00 |
| TiN E/R (Å/min) | 0.7 | TiN E/R (Å/min) | 1.8 |
| W E/R (Å/min) | 5.0 | W E/R (Å/min) | 6.1 |

TABLE 5-continued

| | Example 22 | | Example 23 |
|---|---|---|---|
| 2-(N-morpholino)-ethanesulfonicacid | 0.1 | Methanesulfonicacid | 1.0 |
| Methanesulfonicacid | 0.8 | | |
| BDG | 25 | BDG | 30 |
| DMSO | 35 | DMSO | 20 |
| 2-imidazolidinone | 3.5 | Lutropur G35 | 0.05 |
| balance | 35.6 | balance | 48.95 |
| Hydrogen peroxide | 1.00 | Hydrogen peroxide | 1.00 |
| TiN E/R (Å/min) | 1.6 | TiN E/R (Å/min) | 0.7 |
| W E/R (Å/min) | 6.5 | W E/R (Å/min) | 4.5 |

| | Example 24 | | Example 25 |
|---|---|---|---|
| Methanesulfonicacid | 1.0 | Methanesulfonicacid | 1.0 |
| BDG | 30 | BDG | 30 |
| DMSO | 20 | DMSO | 20 |
| Lutropur G20 | 0.5 | Lutropur G100 | 0.5 |
| balance | 48.5 | balance | 48.5 |
| Hydrogen peroxide | 1.00 | Hydrogen peroxide | 1.00 |
| TiN E/R (Å/min) | 0.6 | TiN E/R (Å/min) | 0.8 |
| W E/R (Å/min) | 8.0 | W E/R (Å/min) | 10.0 |

| | Example 26 | | Example 27 |
|---|---|---|---|
| Methanesulfonicacid | 1.0 | Methanesulfonicacid | 0.5 |
| BDG | 30 | BDG | 20 |
| DMSO | 20 | DMSO | 30 |
| Lutropur FG | 0.5 | Lutropur G35 | 0.05 |
| | | 2-imidazolidinone | 3.5 |
| balance | 48.5 | balance | 45.95 |
| Hydrogen peroxide | 1.00 | Hydrogen peroxide | 1.00 |
| TiN E/R (Å/min) | 0.7 | TiN E/R (Å/min) | 0.8 |
| W E/R (Å/min) | 14.4 | W E/R (Å/min) | 3.0 |

| | Example 28 | | Example 29 |
|---|---|---|---|
| Methanesulfonicacid | 0.1 | Methanesulfonicacid | 0.3 |
| BDG | 30 | BDG | 30 |
| DMSO | 20 | DMSO | 20 |
| Citricacid | 0.05 | HEDP | 0.05 |
| 2-imidazolidinone | 3.5 | 2-imidazolidinone | 3.5 |
| balance | 46.35 | balance | 46.15 |
| Hydrogen peroxide | 1.00 | Hydrogen peroxide | 1.00 |
| TiN E/R (Å/min) | 0.3 | TiN E/R (Å/min) | 0.3 |
| W E/R (Å/min) | 5.7 | W E/R (Å/min) | 1.3 |

| | Example 30 | | Example 31 |
|---|---|---|---|
| Methanesulfonicacid | 0.8 | Methanesulfonicacid | 0.5 |
| BDG | 30 | BDG | 25 |
| DMSO | 20 | DMSO | 35 |
| HEDP | 0.05 | N-Methylmorpholine N-oxide | 0.08 |
| 2-imidazolidinone | 3.5 | 2-imidazolidinone | 3 |
| balance | 45.65 | balance | 36.42 |
| Hydrogen peroxide | 1.00 | Hydrogen peroxide | 1.00 |
| TiN E/R (Å/min) | 0.5 | TiN E/R (Å/min) | 1.8 |
| W E/R (Å/min) | 1.6 | W E/R (Å/min) | 5.4 |

From the results in the above Tables, it is obvious that the inhibitor(s) used allows for control over the etch rate ratio of TiN and W. In addition, FIG. 6 clearly shows that the solutions used in Example 27 and 28 are capable of almost completely removing fluorine containing residues, whilst those skilled in the art will recognize that no trace is left of the inhibitors on the surface after rinsing.

In the present disclosure, the words "a" or "an" are to be taken to include both the singular and the plural. Conversely, any reference to plural items shall, where appropriate, include the singular.

From the foregoing, it will be observed that numerous modifications and variations can be effectuated without departing from the true spirit and scope of the novel concepts of the present disclosure. It is to be understood that no limitation with respect to the illustrated specific embodiments or Examples is intended or should be inferred. The disclosure is intended to cover by the appended claims all such modifications as fall within the scope of the claims.

What is claimed is:

1. A composition, comprising the following components a)-f), based on total weight of the composition:
   a) 0.05-4 wt. % of an aliphatic or aromatic sulfonic acid;
   b) 0.1 to 10 wt % of an inhibitor selected from the group consisting of imidazolidinones, imidazolidines, and 2-oxazolidinones;
   c) 5 to 50 wt % of an aprotic solvent;
   d) 1 to 60 wt % of a glycol ether;
   e) water; and
   an oxidant,
   wherein a weight ratio of the aprotic solvent to the water is from 1:10 to 2:1 and wherein the oxidant is present in a volume ratio of components a) to e)to the oxidant ranging from 65:1 to 8:1.

2. The composition according to claim 1, wherein said aliphatic or aromatic sulfonic acid is selected from the group consisting of: alkyl sulfonic acid, 3-(N-morpholino)propane sulfonic acid, 2-(N-morpholino)ethanesulfonic acid, N-cyclohexyl-2-aminoethanesulfonic acid, 3-[4-(2-hydroxyethyl)-1-piperazinyl]propanesulfonic acid, N-cyclohexyl-3-aminopropanesulfonic acid, and mixtures thereof.

3. The composition according to claim 2, wherein the aliphatic or aromatic sulfonic acid is present in the composition in an amount ranging from 0.1 to 1 wt %, based on the total weight of the composition.

4. The composition according to claim 1, wherein said inhibitor is selected from the group consisting of imidazolidinones, imidazolidines, and mixtures thereof.

5. The composition according to claim 1, wherein said aprotic solvent is selected from the group consisting of dimethyl sulfoxide, sulfolane, propylene carbonate, dimethylacetamide, N-methyl-2-pyrrolidone, dimethylformamide, and mixtures thereof.

6. The composition according to claim 5, wherein the aprotic solvent is present in the composition in an amount ranging from 20 to 45 wt %, based on the total weight of the composition.

7. The composition according to claim 1, wherein said glycol ether is selected from the group consisting of butyl diglycol, 2-hexoxy-1-ethanol, ethylene glycol monomethyl ether, ethylene glycol monoethyl ether, ethylene glycol monobutyl ether, 2-(naphthalene-6-yloxy)polyethoxyethanol, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether diethylene glycol monobutyl ether, diethylene glycol monoisobutyl ether, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, propylene glycol monomethyl ether, propylene glycol dimethyl ether, propylene glycol monobutyl ether, propylene glycol, monoproply ether, dipropylene glycol monomethyl ether, dipropylene glycol monopropyl ether, dipropylene glycol monoisopropyl ether, dipropylenemonobutyl ether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane, 2-(2-butoxyethoxy) ethanol, and mixtures thereof.

8. The composition according to claim 1, further comprising a stabilizer selected from the group consisting of amine-N-oxide, citric acid, 1-hydroxyethane 1,1-diphosphonic acid, glycolic acid, lactic acid, hydroxybutyric acid, glyceric acid, malic acid, tartaric acid, malonic acid, succinic acid, glutaric acid, maleic acid, and mixtures thereof.

9. The composition according to claim 8, wherein the stabilizer is present in the composition in an amount ranging from 0.01 to 0.5 wt %, based on the total weight of the composition.

10. The composition according to claim 1, wherein the weight ratio of the aprotic solvent to the water is from 1:8 to 1:1 and wherein the oxidant is present in a volume ratio of components a) to e) to the oxidant ranging from 65:1 to 12:1.

11. The composition according to claim 1, wherein said oxidant is selected from the group consisting of hydrogen peroxide, peroxide urea, peroxydisulfuric acid, ammonium persulfate, peroxymonosulfuric acid, pyrosulfuric acid, and ozone.

12. The composition according to claim 1, wherein the aprotic solvent is selected from the group consisting of dimethyl sulfoxide (DMSO), dimethylacetamide (DMAc), dimethylformamide (DMF), and mixtures thereof.

13. The composition according to claim 12, wherein said oxidant is selected from the group consisting of hydrogen peroxide, peroxide urea, peroxydisulfuric acid, ammonium persulfate, peroxymonosulfuric acid, pyrosulfuric acid, and ozone.

14. A removal process, comprising:
removing organic and/or inorganic residues from a surface by contacting said surface with the composition according to claim 1.

15. The process according to claim 14, wherein said oxidant is selected from the group consisting of hydrogen peroxide, peroxide urea, peroxydisulfuric acid, ammonium persulfate, peroxymonosulfuric acid, pyrosulfuric acid, and ozone.

16. The process according to claim 14, wherein the organic and/or inorganic residues comprise fluorine.

17. The process according to claim 14, further comprising:
etching TiN from the surface in the presence of tungsten.

18. An etching process, comprising:
etching TiN from a surface by contacting said surface with the composition according to claim 1, in the presence of another metal.

* * * * *